(12) United States Patent
Liu (10) Patent No.: US 10,917,625 B1
(45) Date of Patent: Feb. 9, 2021

(54) TIME MULTIPLEXED DUAL-BAND SENSOR (71) Applicant: Facebook Technologies, LLC, Menlo Park, CA (US)

(72) Inventor: Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/668,241

(22) Filed: Aug. 3, 2017

Related U.S. Application Data (60) Provisional application No. 62/410,687, filed on Oct. 20, 2016.

(51) Int. Cl.
*H01L 27/30* (2006.01)
*H04N 13/211* (2018.01)
*H04N 5/33* (2006.01)
*H04N 13/161* (2018.01)
*H04N 13/254* (2018.01)
*H04N 13/296* (2018.01)
*H04N 13/344* (2018.01)

(52) U.S. Cl.
CPC .......... *H04N 13/211* (2018.05); *H04N 5/33* (2013.01); *H04N 13/161* (2018.05); *H04N 13/254* (2018.05); *H04N 13/296* (2018.05); *H04N 13/344* (2018.05)

(58) Field of Classification Search
CPC .... A61B 1/00165; A61B 1/00167; A61B 1/12
See application file for complete search history.

(56) References Cited

U.S. PATENT DOCUMENTS

| | | | |
|---|---|---|---|
| 8,779,346 B2 | 7/2014 | Fowler et al. | |
| 9,094,629 B2 | 7/2015 | Ishibashi | |
| 9,185,273 B2 | 11/2015 | Beck et al. | |
| 9,363,454 B2 | 6/2016 | Ito et al. | |
| 9,531,990 B1 * | 12/2016 | Wilkins | H04N 7/00 |

(Continued)

FOREIGN PATENT DOCUMENTS

| | | |
|---|---|---|
| EP | 1746820 A1 | 1/2007 |
| WO | 2017069706 A1 | 4/2017 |

OTHER PUBLICATIONS

U.S. Appl. No. 15/847,517, "Non-Final Office Action", dated Nov. 23, 2018, 21 pages.

(Continued)

*Primary Examiner* — Md N Haque
(74) *Attorney, Agent, or Firm* — Kilpatrick Townsend & Stockton (57) ABSTRACT

A dual-band pixel includes a backside passivation layer, a corresponding input terminal coupled to the backside passivation layer, a first n-type layer covering the backside passivation layer, a p-type layer covering the first n-type layer, a second n-type layer within the p-type layer, and a pinning layer covering the second n-type layer. A first or second voltage is applied to the corresponding input terminal to operate the dual-band pixel in a visible or infrared (IR) mode. A depth camera assembly (DCA) may include a sensor pixel array comprising a plurality of dual-band pixels. The DCA may take visible or IR images in a time multiplexed manner using the sensor pixel array and determine depth information based on the captured IR images.

22 Claims, 8 Drawing Sheets

(56) References Cited

U.S. PATENT DOCUMENTS

| | | |
|---|---|---|
| 2003/0020100 A1 | 1/2003 | Guidash |
| 2004/0251483 A1 | 12/2004 | Ko et al. |
| 2007/0076481 A1 | 4/2007 | Tennant |
| 2007/0102740 A1 | 5/2007 | Ellis-Monaghan et al. |
| 2007/0222881 A1 | 9/2007 | Mentzer |
| 2008/0068478 A1* | 3/2008 | Watanabe ......... H01L 27/14621 348/294 |
| 2009/0224139 A1 | 9/2009 | Buettgen et al. |
| 2010/0140732 A1 | 6/2010 | Eminoglu et al. |
| 2010/0276572 A1 | 11/2010 | Iwabuchi et al. |
| 2011/0254986 A1 | 10/2011 | Nishimura et al. |
| 2012/0092677 A1 | 4/2012 | Suehira et al. |
| 2012/0127284 A1* | 5/2012 | Bar-Zeev ............ G02B 27/017 348/53 |
| 2012/0133807 A1 | 5/2012 | Wu et al. |
| 2012/0188420 A1* | 7/2012 | Black ................. H04N 5/2253 348/279 |
| 2012/0241591 A1 | 9/2012 | Wan et al. |
| 2013/0056809 A1 | 3/2013 | Mao et al. |
| 2013/0113969 A1 | 5/2013 | Manabe et al. |
| 2013/0141619 A1 | 6/2013 | Lim et al. |
| 2013/0207219 A1 | 8/2013 | Ahn |
| 2013/0234029 A1 | 9/2013 | Bikumandla |
| 2013/0299674 A1 | 11/2013 | Fowler et al. |
| 2014/0021574 A1 | 1/2014 | Egawa |
| 2014/0042299 A1 | 2/2014 | Wan et al. |
| 2015/0189209 A1 | 7/2015 | Yang et al. |
| 2015/0279884 A1 | 10/2015 | Kusumoto |
| 2015/0287766 A1* | 10/2015 | Kim .................... H01L 27/307 250/208.1 |
| 2015/0312502 A1 | 10/2015 | Borremans |
| 2015/0358569 A1 | 12/2015 | Egawa |
| 2016/0088253 A1 | 3/2016 | Tezuka |
| 2016/0100115 A1 | 4/2016 | Kusano |
| 2016/0111457 A1 | 4/2016 | Sekine |
| 2016/0165160 A1 | 6/2016 | Hseih et al. |
| 2016/0204150 A1 | 7/2016 | Oh et al. |
| 2016/0307945 A1* | 10/2016 | Madurawe ........ H01L 27/14607 |
| 2016/0337605 A1 | 11/2016 | Ito |
| 2016/0360127 A1 | 12/2016 | Dierickx et al. |
| 2017/0207268 A1 | 7/2017 | Kurokawa |
| 2018/0019269 A1 | 1/2018 | Klipstein |
| 2019/0172868 A1 | 6/2019 | Chen et al. |
| 2019/0348460 A1 | 11/2019 | Chen et al. |

OTHER PUBLICATIONS

U.S. Appl. No. 16/210,748, "Final Office Action", Jul. 7, 2020, dated 11 pages.

U.S. Appl. No. 16/210,748, "Non-Final Office Action", Jan. 31, 2020, dated 11 pages.

U.S. Appl. No. 16/384,720, "Non-Final Office Action", dated May 1, 2020, 6 pages.

U.S. Appl. No. 16/436,049, "Non-Final Office Action", dated Jun. 30, 2020, 11 pages.

U.S. Appl. No. 16/436,049, "Non-Final Office Action", dated Mar. 4, 2020, 9 pages.

Cho, et al., "A Low Power Dual CDS for a Column-Parallel CMOS Image Sensor", Journal of Semiconductor Technology and Science, vol. 12, No. 4, Dec. 30, 2012, pp. 388-396.

EP18179838.0, "Partial European Search Report", dated Dec. 5, 2018, 14 pages.

EP18179846.3, "Extended European Search Report", dated Dec. 7, 2018, 10 pages.

EP18179851.3, "Extended European Search Report", dated Dec. 7, 2018, 8 pages.

PCT/US2018/039352, "International Search Report and Written Opinion", dated Oct. 26, 2018, 10 pages.

PCT/US2018/039431, "International Search Report and Written Opinion", dated Nov. 7, 2018, 14 pages.

PCT/US2018/064181, "International Preliminary Report on Patentability", dated Jun. 18, 2020, 9 pages.

PCT/US2018/064181, "International Search Report and Written Opinion", dated Mar. 29, 2019, 12 pages.

PCT/US2019/027727, "International Search Report and Written Opinion", dated Jun. 27, 2019, 11 pages.

PCT/US2019/031521, "International Search Report and Written Opinion", dated Jul. 11, 2019, 11 pages.

PCT/US2019/036536, "International Search Report and Written Opinion", dated Sep. 26, 2019, 14 pages.

U.S. Appl. No. 16/384,720, "Notice of Allowance", dated Aug. 26, 2020, 8 pages.

* cited by examiner

TIME MULTIPLEXED DUAL-BAND SENSOR

RELATED APPLICATION

This application claims the benefit of U.S. Provisional Application No. 62/410,687 filed Oct. 20, 2016, the content of which is incorporated by reference in its entirety herein.

BACKGROUND

The present disclosure generally relates to an imaging device of a virtual, augmented, or mixed reality (VR, AR, or MR) systems, and more specifically relates to capturing visible and near infrared (IR) images.

VR, AR, and MR systems often include features such as depth sensing, environment mapping, device and head pose tracking, body and hand tracking, and surface texture reconstruction. Thus, both visible and infrared (IR) images are captured for supporting these features in such systems. For example, captured visible images may be useful for color and surface texture information and captured IR images may be useful for distance and geometry information when using either structured light (SL) or time-of-flight (TOF) scheme. To capture both visible and IR images, traditional imaging devices in a VR, AR, or MR system include two cameras: one camera for capturing visible images and one camera for capturing IR images. However, a system including two cameras may be high in cost and may have strict requirements regarding the mechanical stability between the two cameras. Alternatively, a single camera with spatially multiplexed visible and IR sensor pixels may be used to capture both visible and IR images. However, such a camera has disadvantages such as requiring additional filters for filtering or blocking IR light, requiring interpolation to produce full resolution images, having a non-standard layout that cannot be used with standard image signal processing and color demosaicing algorithms, and having reduced efficiency in sensing IR light in active illumination mode since only a portion of the sensor pixels are used to detect IR light.

SUMMARY

A dual-band pixel includes a backside passivation layer, a first n-type layer covering the backside passivation layer, a corresponding input terminal coupled to the first n-type layer, a p-type layer covering the first n-type layer, a second n-type layer within the p-type layer, and a pinning layer covering the second n-type layer. A first or second voltage is applied to the corresponding input terminal to operate the dual-band pixel in a visible or infrared (IR) mode. A depth camera assembly (DCA) may include a sensor pixel array comprising a plurality of dual-band pixels. The DCA may capture visible or IR images in a time multiplexed manner using the sensor pixel array and determine depth information based on the captured IR images.

A depth camera assembly (DCA) that may be part of a head-mounted display (HMD) includes an illumination source, an imaging device, and a controller. The illumination source projects light (e.g., IR SL and/or IR light for TOF) into a local area. The imaging device includes a sensor pixel array and captures one or more first images (e.g., visible images) of the local area illuminated with ambient light while applying a first voltage to a corresponding input terminal of each pixel in the sensor pixel array. The imaging device captures one or more second images (e.g., IR images) of the local area illuminated with light from the illumination source while applying a second voltage to the corresponding input terminal of each pixel in the sensor pixel array. A controller instructs the imaging device to apply the first voltage to the corresponding input terminal of each pixel and capture the one or more first images of the local area illuminated with the ambient light. The controller instructs the illumination source to illuminate the local area comprising one or more objects and instructs the imaging device to apply the second voltage to the corresponding input terminal of each pixel and capture the one or more second images of the local area illuminated with light from the illumination source. The controller determines depth information for the illuminated one or more objects based on the captured one or more second images.

In some embodiments, the DCA may be part of a head-mounted display (HMD) for use in a virtual reality (VR), mixed reality (MR), augmented reality (AR), or some combination thereof, system environment.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Disclosed is a time multiplexed dual-band (Visible—Infrared) sensor. The dual-band sensor is based on visible light and IR light having different photon absorption depths in silicon. Most visible photons (e.g., photons with wavelengths that can range from ~400-700 nm) are absorbed at the top surface of the dual-band sensor while a significant portion of IR photons (e.g., near IR photons with wavelengths that can range from ~700-1100 nm) are absorbed deep into the silicon. For example, visible light between 400-650 nm may be absorbed within 1-2 microns of silicon while IR light at 850 nm may have an absorption depth more than 10 microns thick of silicon. Thus, a dual-band sensor includes a first photodiode near the surface of the dual-band sensor for absorption of the visible photons (e.g., photons in a visible band) to generate visible photoelectrons and a second photodiode further away from the surface of the dual-band sensor for absorption of IR photons (e.g., photons in an IR band) to create IR photoelectrons. A first bias voltage can be applied to the dual-band sensor to operate in a visible mode and a second bias voltage can be applied to the dual-band sensor to operate in an IR mode. The dual-band sensor may be covered in traditional Bayer color filter pattern or a different type of color filter array and use temporal multiplexing to operate either in a visible mode or an IR mode to produce full resolution visible and IR images without pixel spatial interpolation. Alternatively, the dual-band sensor may be covered with a different type of color filter pattern, for example RGBE (red, green, blue, and emerald), CYYM (cyan, yellow, yellow, magenta), CYGM (cyan, yellow, green, and magenta), or RGBW (red, green, blue, and white). A dual-band sensor operating in a visible mode is configured to primarily collect visible photoelectrons. A dual-band sensor operating in an IR mode is configured to primarily collect IR photoelectrons. Advantages of a time multiplexed dual-band sensor include: not requiring additional filters for filtering or blocking IR light, having a standard layout (e.g., Bayer pattern) that can be used with existing image signal processing and color demosaicing algorithms, having reduced crosstalk between pixels (e.g., IR and visible in spatial multiplexing), and having increased efficiency in sensing IR light in active illumination mode since all of the sensor pixels are used to detect IR light. The time multiplexing enables a 1:1 overlay between a visible pixel and an IR pixel, which has advantages such as when reconstructing a 3D object in space with both surface texture and 3D geometry in which the exact matching of color/visible pixel and depth pixel (from IR) is critical. Another advantage is for structured light application where an IR light dot pattern is projected into the space and the sensor is used to detect and estimate the dot centroid spatial location at sub-pixel accuracy. The proposed solution produces a true full IR resolution image that results in higher sub-pixel accuracy, while the spatial multiplexed visible/IR imaging system will have worse dot centroid estimation accuracy. The centroid accuracy directly relates to depth accuracy.

Figure 1A:
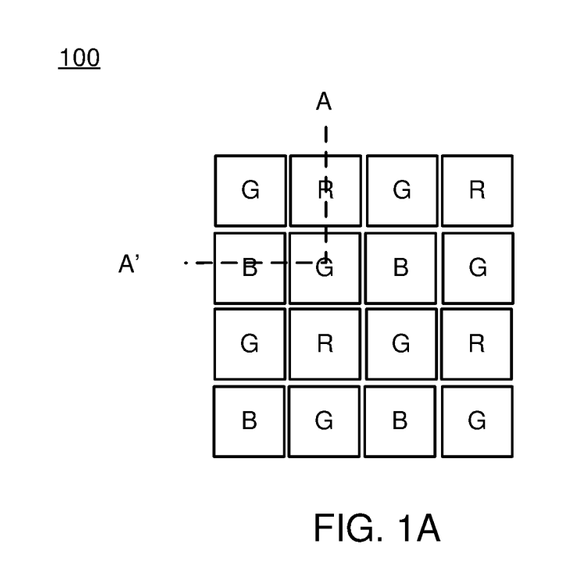
FIG. 1A is a top view of a portion of a dual-band sensor pixel array covered with a color filter pattern, according to one embodiment.

FIG. 1A is a top view 100 of a portion of a dual-band sensor pixel array covered with a color filter pattern, according to one embodiment. In this embodiment, the dual-band sensor pixel array contains pixels of a square shape and the dual-band sensor pixels are covered with a Bayer pattern color filter. The Bayer pattern color filter includes twice as many green color filters as red or blue color filters corresponding to pixels in the dual-band sensor pixel array. For example, the portion of the dual-band sensor pixel array shown in FIG. 1A includes a dual-band sensor pixel array with four rows and four columns covered with alternating rows of GRGR color filters and BGBG color filters. In alternate embodiments, one or more of the pixels of the dual-band sensor pixels of the dual-band sensor pixel array is not covered with a color filter.

Figure 1B:
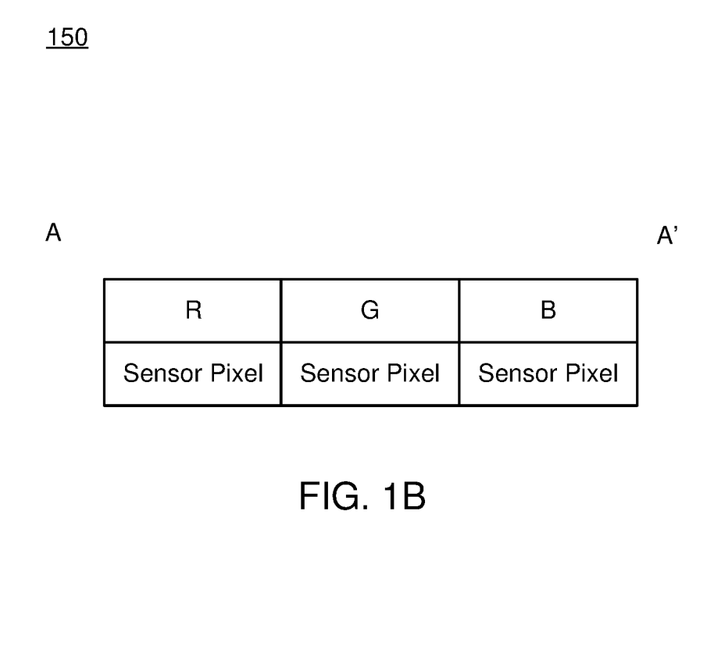
FIG. 1B is a cross section of a portion of a dual-band sensor pixel array covered with a color filter pattern, according to one embodiment.

FIG. 1B is a cross section 150 of a portion of a dual-band sensor pixel array covered with a color filter pattern taken along line A-A' of FIG. 1A, according to one embodiment. The cross section 150 illustrates a red color filter, green color filter, and blue color filter covering a corresponding dual-band sensor pixel.

Figure 2:
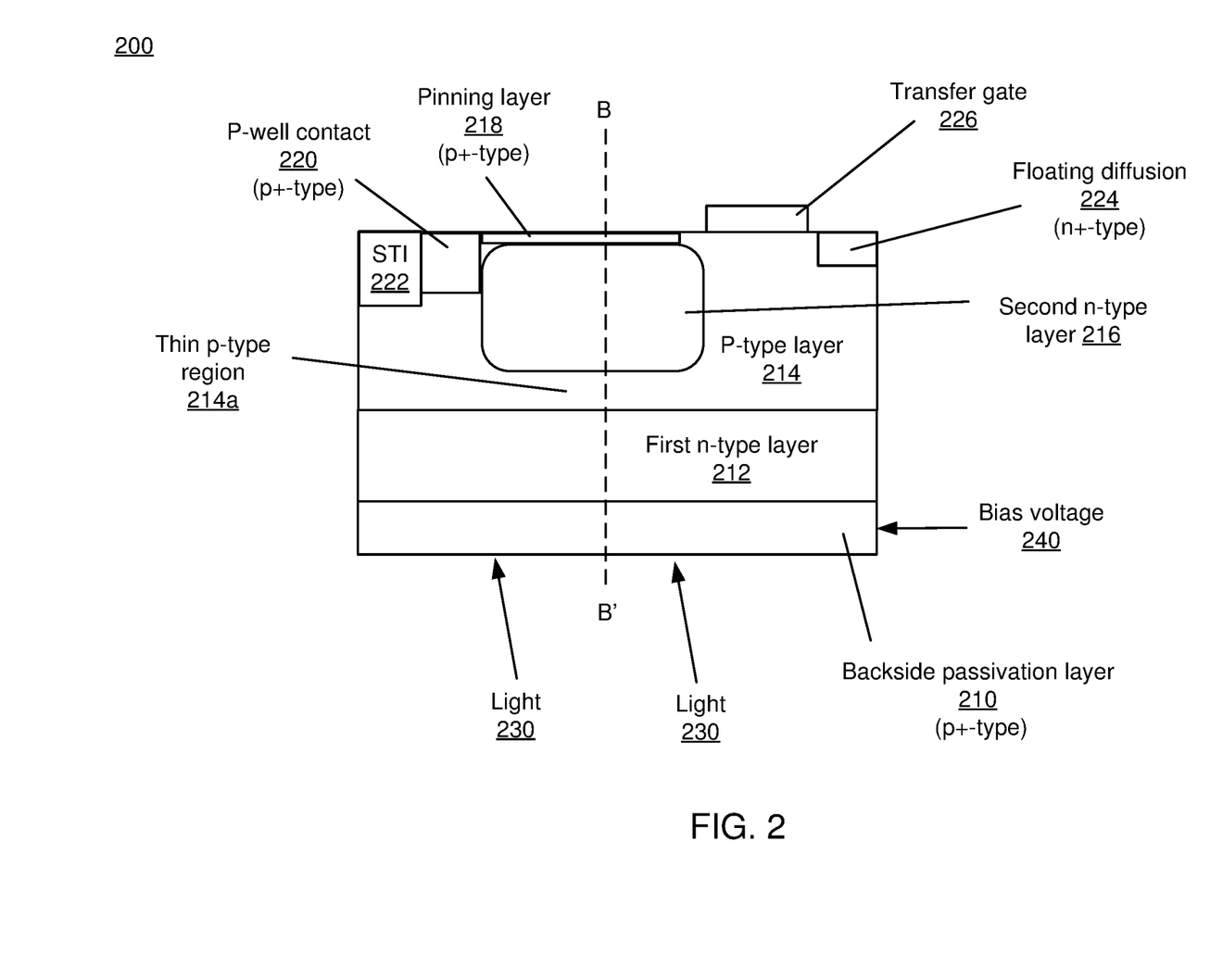
FIG. 2 is a cross section of a dual-band sensor pixel, in accordance with an embodiment.

FIG. 2 is a cross section 200 of a dual-band sensor pixel, in accordance with an embodiment. The dual-band sensor pixel includes a backside passivation layer 210, a first n-type layer 212, a p-type layer 214, a second n-type layer 216, a pinning layer 218, a p-well contact 220, a shallow trench isolation (STI) 222, a floating diffusion 224, and a transfer gate 226. Light 230 impinges on the dual-band sensor pixel on the backside passivation layer 210. A color filter array may cover the backside passivation layer 210 such that color filtered visible light and IR light (e.g., light not filtered by the color filter) from light 230 is incident on the dual-band sensor pixel. A first photodiode includes the first n-type layer 212. The second photodiode includes the second n-type layer 216. The first photodiode is closer to the surface of the dual-band sensor pixel (e.g., backside passivation layer 210) than the second photodiode. Light 230 may include visible light and IR light. The first photodiode may absorb more visible light (or color filtered visible light) and the second photodiode may absorb more IR light.

The backside passivation layer 210 is a p+-type semiconductor material (e.g., doped silicon). The backside passivation layer 210 may be a p+-type semiconductor substrate. Light 230 impinges on the dual-band sensor pixel through the backside passivation layer 210. The backside passivation layer 210 thickness is in the range of hundreds of nanometers, and the doping concentration is in the range of $10^{16}$ to $10^{18}$ particles per cubic centimeter.

A bias voltage 240 may be applied to the back side passivation layer 210. A first voltage is applied to the back side passivation layer 210 to operate the dual-band sensor in a visible mode. The first voltage may be a negative voltage. A second voltage is applied to the backside passivation layer 210 to operate the dual-band sensor in an IR mode. The second voltage may be a positive voltage. The bias voltage 240 is applied to the backside passivation layer 210 via an electrode connected to the backside passivation layer 210. The visible mode and IR mode will be further described in the detailed description of FIGS. 3A, 3B, and 3C.

The first n-type layer 212 covers the backside passivation layer 210. The first n-type layer 212 may be formed by doping a depth of an original p-type epi layer that is part of the wafer starting material with n-type impurities via diffusion or ion implantation. A first photodiode includes the first n-type layer 212. The first photodiode may absorb most of the visible photons from light 230 because of its proximity (e.g., within 2-3 micrometers) to sensor surface.

The p-type layer 214 covers the first n-type layer 212. The p-type layer 214 may be formed by doping a depth of the first n-type layer 212 with p-type impurities via diffusion or ion implantation. A thin p-type region 214a is included in the p-type layer 214. The thickness of the thin p-type region 214a is in the range of a few hundreds of nanometers. The doping concentration of the thin p-type region 214a is around $10^{15}$ particles per cubic centimeter.

The second n-type layer 216 is in the p-type layer 214. The second n-type layer 216 may be formed by masking regions of the p-type layer 214 and doping a depth of the thickness of the p-type layer 214 with n-type impurities via diffusion or ion implantation. A remaining depth of the p-type layer 214 below the second n-type layer 216 is the thin p-type region 214a. The thickness of the second n-type layer 216 is in the range of a few micrometers to 10 micrometers. The doping concentration of the second n-type layer 216 is in the range $10^{13}$ to $10^{14}$ particles per cubic centimeter.

A second photodiode includes the second n-type layer 216. The second n-type layer 216 may be formed by masking off portions of the p-type layer 214 and doping a depth of the p-type layer 214 to form a height of a second n-type layer 216. The second photodiode is located a distance further from the surface of the dual-band sensor pixel such that the second photodiode can absorb a significant portion of the IR photons (e.g., 10 microns or more). The second photodiode is a pinned photodiode and also include the p-type layer 214, a pinning layer 218, a floating diffusion 224, and a transfer gate 226.

The pinning layer 218 covers the second n-type layer 216. The pinning layer 218 is made of p+-type material. The pinning layer 218 may be formed on the second n-type layer 216 by using the same or a similar mask used to form the second n-type layer 216 on the p-type layer 214. The second n-type layer may be doped with p-type impurities in a depth shallower than a height of the second n-type layer 216 to form the pinning layer 218 on the second n-type layer 216. The pinning layer 218 prevents the dark current (e.g., charge generated due to silicon defects and surface traps other than charge generated due to photons) from moving into the second n-type layer 216 and hence reduces noise. The thickness of the pinning layer 218 is in the range of tens of nanometers. The doping concentration of the pinning layer 218 is in the range of $10^{17}$ to $10^{19}$ particles per cubic centimeter.

The p-well contact 220 is made of a p+-type material. The p-well contact 220 may be formed by masking and doping the p-type layer 214 with p-type impurities a depth that is a height of the p-well contact 220. The p-well contact 220 is adjacent to the STI 222 and a portion of a side of the n-type layer 216 and a side of the pinning layer 218. The p-well contact provides an electrical connection to the p-type layer 214 and the pinning layer 218. A zero voltage (ground) voltage may be applied to the p-well contact 220 so both the p-type layer 214 and the pinning layer 218 are biased at 0V.

The STI 222 is used to isolate neighboring sensor pixels from one another. The STI 222 may be formed by patterning the p-type layer 214 (e.g., via photolithography and etching), depositing an oxide layer, and planarizing the oxide layer with chemical mechanical planarization (CMP). Thus, the remaining oxide layer embedded in the p-type layer 214 form STI 222 between pixels for isolation.

The floating diffusion 224 is made of n+-type material. The floating diffusion 224 may be formed by masking and doping the p-type layer 214 with n-type impurities a depth that is a height of the floating diffusion 224. A transfer gate 226 may serve as a portion of a mask for the floating diffusion 224 during diffusion or ion implantation. Signal charge from the second photodiode can be transferred from the n-type layer 216 to the floating diffusion 224 via the transfer gate 226.

The transfer gate 226 covers portions of the p-type layer 214 and is positioned laterally between the n-type layer 216 and the floating diffusion 224. The transfer gate 226 may be formed by depositing and patterning a gate dielectric and a gate metal layer on the p-type layer 214. A voltage can be applied to the transfer gate 226 to allow signal charge from the second photodiode (e.g., electrons formed in the n-type layer 216) to transfer to the floating diffusion 224. When 0V is applied to transfer gate 226, charge is accumulated and stored in the n-type layer 216. When a positive voltage (e.g., 3.3V) is applied to transfer gate 226, signal charge accumulated in the n-type layer 216 is transferred to the floating diffusion 224.

Figure 3A:
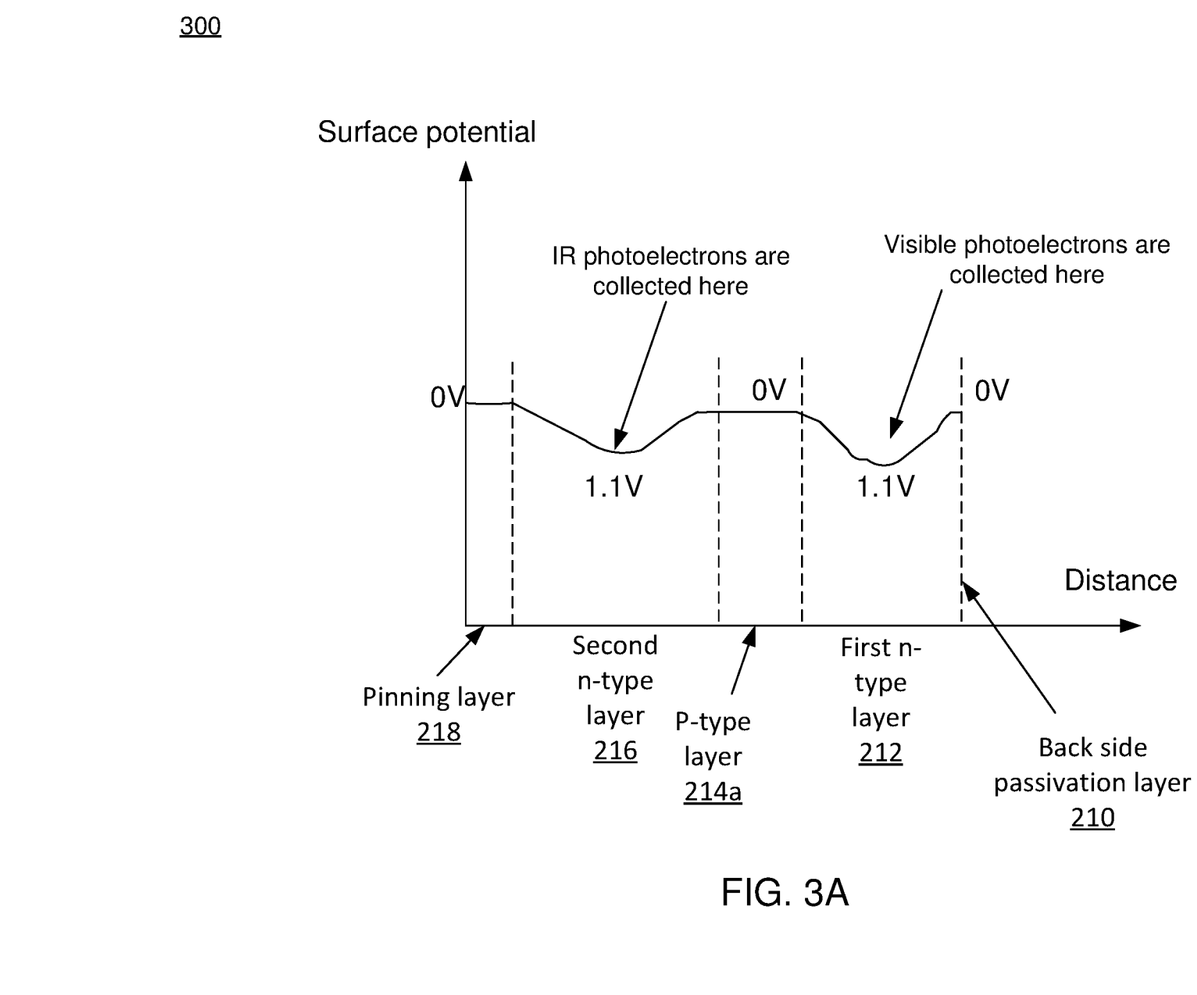
FIG. 3A depicts a graph of surface potential vs. distance taken along line B-B' of a dual-band sensor pixel operating in a first step of a visible mode, in accordance with an embodiment.

FIG. 3A depicts a graph 300 of the surface potential vs. distance taken along line B-B' of a dual-band sensor pixel operating in a first step of a visible mode, in accordance with an embodiment. A dual-band sensor operating in a visible mode is configured such that the dual-band sensor primarily collects visible photoelectrons. In this mode, an active illumination source that emits IR light to be detected by the dual-band sensor is not operated so that the dual-band sensor primarily collects visible light and only a small amount of ambient IR light. FIG. 3A depicts the first step, the exposure period of the visible mode.

Light 230 enters the dual-band sensor at a distance indicated on the horizontal axis labeled as the backside passivation layer 210. The surface potential is 0V at the backside passivation layer 210, the thin p-type region 214a, and the pinning layer 218 which are biased to 0V. The first and second n-type layer 212 and 216 are isolated and their built-in potential is determined by the doping concentrations, for example, at 1.1V. In this potential profile, the visible photoelectrons generated in the first photodiode are collected in the first n-type layer 212, and the ambient IR photoelectrons generated in the second photodiode are collected in the second n-type layer 216. At the end of exposure time, the photoelectrons accumulated in the second n-type layer 216 are transferred to floating diffusion 224 by applying a positive voltage to the transfer gate 226, and the second n-type layer 216 is cleared of charge. The photoelectrons in floating diffusion 224 can be eliminated via a reset process. This process prevents the ambient IR photoelectrons from corrupting the visible light photoelectrons that stored in the first n-type layer 212.

Figure 3B:
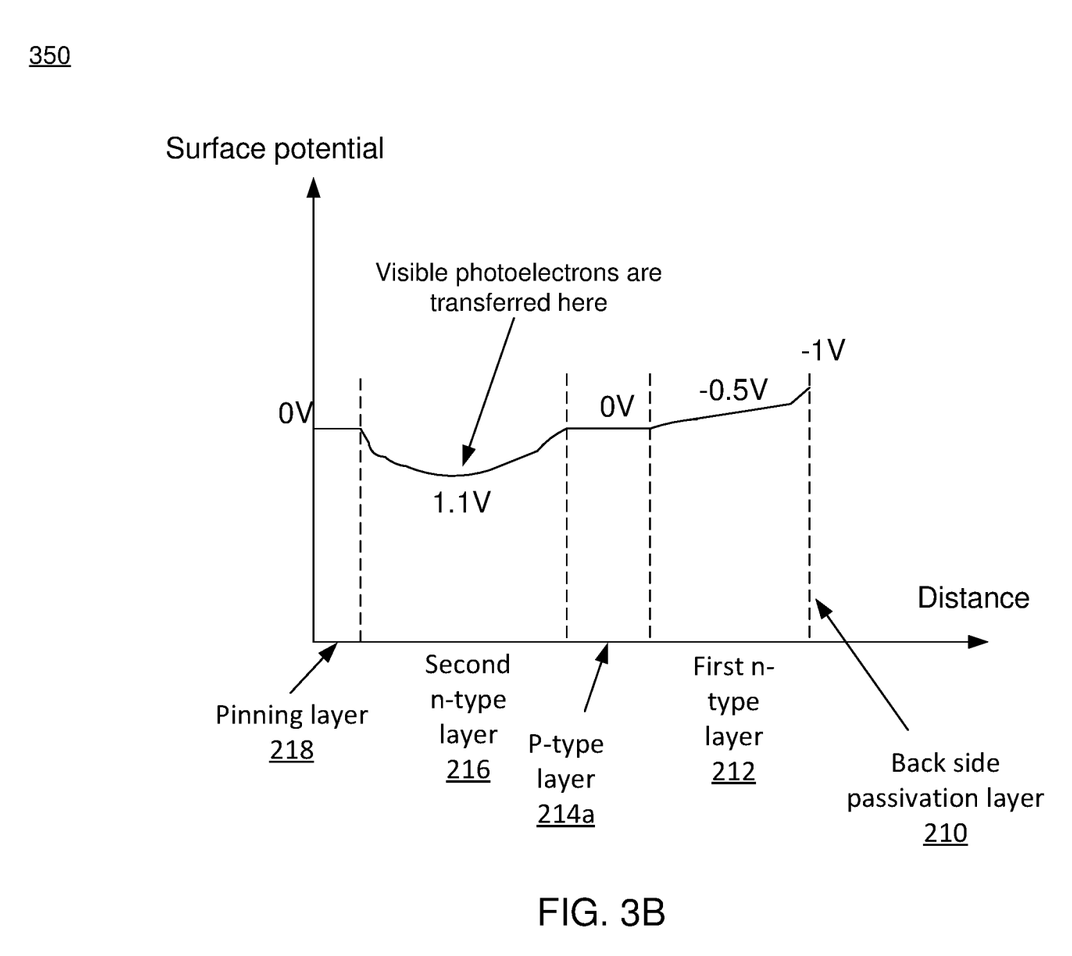
FIG. 3B depicts a graph of surface potential vs. distance taken along line B-B' of a dual-band sensor pixel operating in a second step of the visible mode, in accordance with an embodiment.

FIG. 3B depicts a graph 350 of the surface potential vs. distance taken along line B-B' of a dual-band sensor pixel in a second step of the visible mode, in accordance with an embodiment. A negative voltage, for example, −1V, is applied to the back side passivation layer 210. This voltage changes the potential of the first n-type layer 212 such that the first n-type layer 212 becomes negative. The accumulated visible photoelectrons inside the first n-type layer 212 during the first step of the visible mode are transferred from the first n-type layer 212 to the second n-type layer 216 due to the new potential profile. After floating diffusion 224 is reset (hence cleared of charge), the visible photoelectrons are transferred from the first n-type layer 212 to the floating diffusion 224 and read out as visible signal.

Figure 3C:
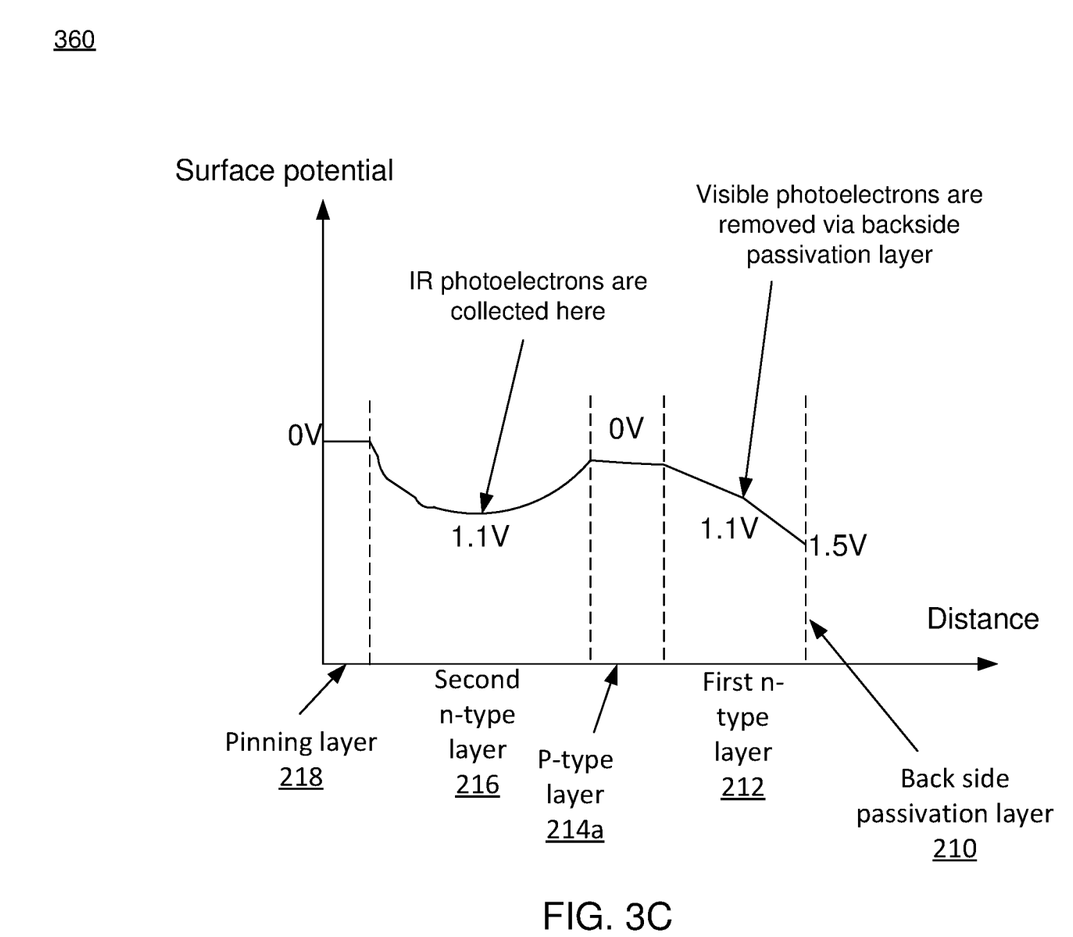
FIG. 3C depicts a graph of surface potential vs. distance taken along line B-B' of a dual-band sensor pixel operating in an IR mode, in accordance with an embodiment.

FIG. 3C depicts a graph 360 of the surface potential vs. distance taken along line B-B' of a dual-band sensor pixel in the IR mode, in accordance with an embodiment. A dual-band sensor operating in an IR mode is configured such that the dual-band sensor primarily collects IR photoelectrons. Light 230 enters the dual-band sensor at a distance indicated on the horizontal axis labeled as the backside passivation layer 210. The surface potential is 0V at the p-type layer 214, and the pinning layer 218. The second n-type layer 216 is isolated and its built-in potential is at 1.1V. A positive voltage, for example 1.5V, is applied to the backside passivation layer 210. The potential of the first n-type layer 212 is at 1.1V.

In one embodiment, an active illumination source emits IR light to be detected by the dual-band sensor. The dual-band sensor collects both visible photoelectrons in the first n-type layer 212 and IR photoelectrons in the second n-type layer 216. The visible photoelectrons can be generated by absorption of visible portion of light 230 in a first photodiode including the first n-type layer 212. The visible photoelectrons in the first n-type layer 212 move to the backside passivation layer 210 due to its higher positive voltage. These visible photoelectrons are thus drained away via the electrical connection to the backside passivation layer 210. The IR photoelectrons can be generated by absorption of IR portion of light 230 in the second photodiode including the second n-type layer 216. To operate in an IR mode, the visible photoelectrons are drained away from the first n-type layer 212 and only the IR photoelectrons from the second n-type layer 216 are collected.

System Overview

Figure 4:
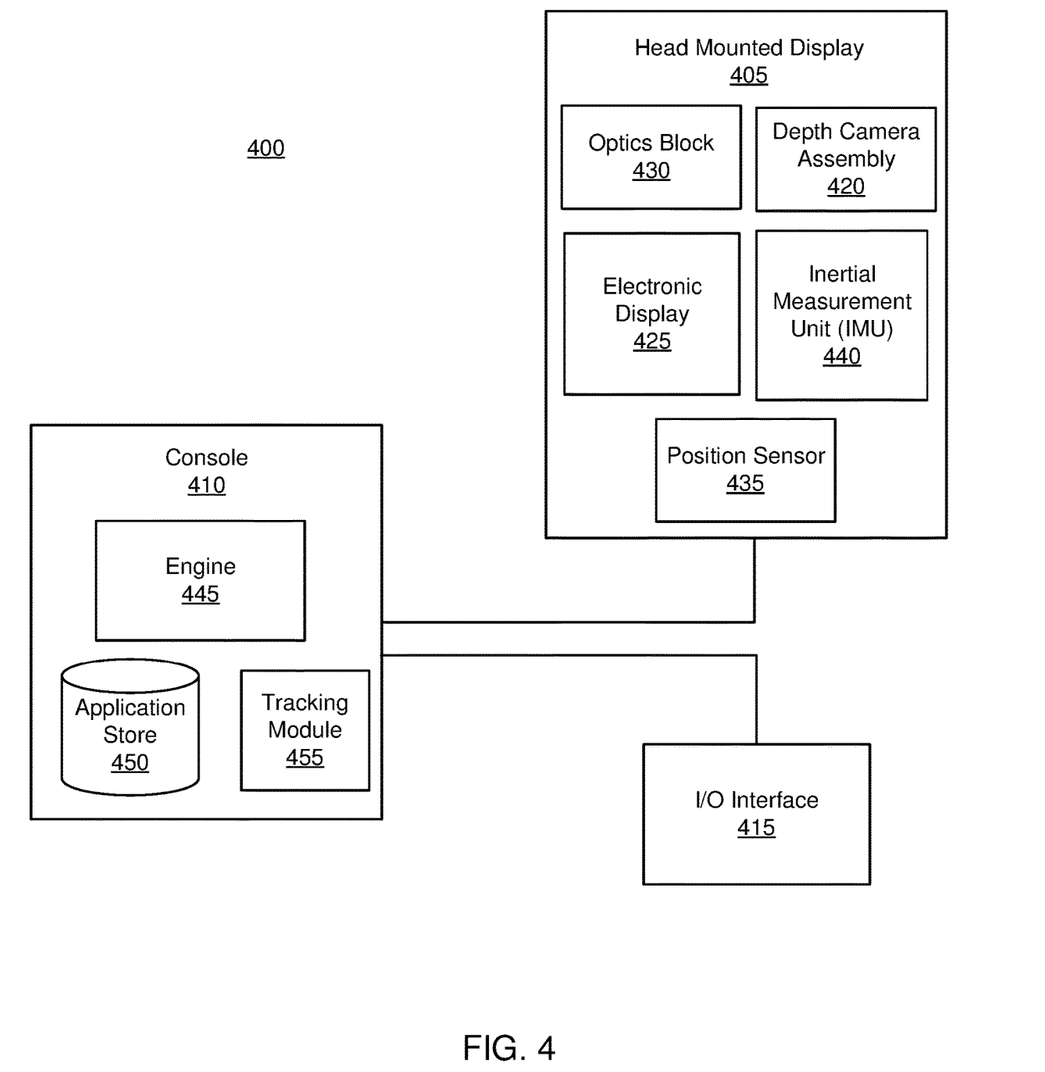
FIG. 4 is a block diagram of a system environment including a depth camera assembly including an imaging device with the dual-band sensor pixel array, in accordance with an embodiment.

FIG. 4 is a block diagram of a system environment 400 including a depth camera assembly 420, according to an embodiment. The system 400 may operate in a VR, AR, or MR environment, or some combination thereof. The system 400 shown by FIG. 4 comprises a HMD 405 and an input/output (I/O) interface 415 that is coupled to a console 410. While FIG. 4 shows an example system 400 including one HMD 405 and one I/O interface 415, in other embodiments any number of these components may be included in the system 400. For example, there may be multiple HMDs 405 each having an associated I/O interface 415 with each HMD 405 and I/O interface 415 communicating with the console 410. In alternative configurations, different and/or additional components may be included in the system 400. Additionally, functionality described in conjunction with one or more of the components shown in FIG. 4 may be distributed among the components in a different manner than described in conjunction with FIG. 4 in some embodiments. For example, some or all of the functionality of the console 410 is provided by the HMD 405.

The HMD 405 is a head-mounted display that presents content to a user comprising augmented views of a physical, real-world environment with computer-generated elements (e.g., two dimensional (2D) or three dimensional (3D) images, 2D or 3D video, sound, etc.). In some embodiments, the presented content includes audio that is presented via an external device (e.g., speakers and/or headphones) that receives audio information from the HMD 405, the console 410, or both, and presents audio data based on the audio information. The HMD 405 may comprise one or more rigid bodies, which may be rigidly or non-rigidly coupled to each other together. A rigid coupling between rigid bodies causes the coupled rigid bodies to act as a single rigid entity. In contrast, a non-rigid coupling between rigid bodies allows the rigid bodies to move relative to each other. In some embodiments, the HMD 405 may also act as a headset that presents virtual content to the user that is based in part on a real environment surrounding the user. For example, virtual content may be presented to a user of the HMD. The user physically may be in a room, and virtual walls and a virtual floor of the room are rendered as part of the virtual content.

The HMD 405 includes a depth camera assembly (DCA) 420, an electronic display 425, an optics block 430, one or more position sensors 435, and an inertial measurement Unit (IMU) 440. Some embodiments of The HMD 405 have different components than those described in conjunction with FIG. 4. Additionally, the functionality provided by various components described in conjunction with FIG. 4 may be differently distributed among the components of the HMD 405 in other embodiments, or be captured in separate assemblies remote from the HMD 405.

The DCA 420 captures data describing depth information of an area surrounding the HMD 405. The data describing depth information is associated with a SL technique to determine depth information. Alternatively, the data describing depth information is associated with a TOF technique to determine depth information. The DCA 420 can compute the depth information using the data, or the DCA 420 can send this information to another device such as the console 410 that can determine the depth information using data from the DCA 420.

In one embodiment, the DCA 420 includes an illumination source, an imaging device, and a controller. The illumination source emits SL of different types (e.g. lines, grids, or dots) onto a portion of an area surrounding the HMD. The deformation of the SL pattern on surfaces of objects allows the DCA 420 to determine the depth and surface information of objects in the area surrounding the DCA 420. The imaging device captures images of SL from the illumination source that is reflected from objects in a portion of the area surrounding the DCA 420. Alternatively, the illumination source emits IR light for TOF (e.g., determining depth information using a TOF technique). The imaging device may be a detector array, camera or video camera. In one embodiment, the imaging device includes a dual-band sensor pixel array to capture both visible and IR light. The dual-band sensor pixel array may support an IR mode and a visible mode. The dual-band sensor pixel array may be covered in traditional Bayer color filter pattern and use temporal multiplexing by applying a bias voltage to operate the pixel array either in a visible mode or an IR mode to produce full resolution visible and IR images without pixel spatial interpolation. For example, the imaging device may use the dual-band sensor pixels in an IR mode to capture IR light (e.g., SL or IR light for TOF) emitted from an illumination source. In an IR mode, both visible photoelectrons and IR photoelectrons may be collected, but the visible photoelectrons may be drained away and only the visible photoelectrons are collected. The imaging device may use the dual-band sensor pixels in a visible mode. In a visible mode, both visible and IR photoelectrons may be collected, but the active illumination source emitting IR light may be turned off. Thus, the majority of the photoelectrons would be visible photoelectrons.

The electronic display 425 displays 2D or 3D images to the user in accordance with data received from the console 410. In various embodiments, the electronic display 425 comprises a single electronic display or multiple electronic displays (e.g., a display for each eye of a user). Examples of the electronic display 425 include: a liquid crystal display (LCD), an organic light emitting diode (OLED) display, an active-matrix organic light-emitting diode display (AMOLED), some other display, or some combination thereof.

The optics block 430 magnifies image light received from the electronic display 425, corrects optical errors associated with the image light, and presents the corrected image light to a user of the HMD 405. In various embodiments, the optics block 430 includes one or more optical elements. Example optical elements included in the optics block 430 include: an aperture, a Fresnel lens, a convex lens, a concave lens, a filter, a reflecting surface, or any other suitable optical element that affects image light. Moreover, the optics block 430 may include combinations of different optical elements. In some embodiments, one or more of the optical elements in the optics block 430 may have one or more coatings, such as partially reflective or anti-reflective coatings.

Magnification and focusing of the image light by the optics block 430 allows the electronic display 425 to be physically smaller, weigh less, and consume less power than larger displays. Additionally, magnification may increase the field of view of the content presented by the electronic display 425. For example, the field of view of the displayed content is such that the displayed content is presented using almost all (e.g., approximately 110 degrees diagonal), and in some cases all, of the user's field of view. Additionally in some embodiments, the amount of magnification may be adjusted by adding or removing optical elements.

In some embodiments, the optics block 430 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display 425 for display is pre-distorted, and the optics block 430 corrects the distortion when it receives image light from the electronic display 425 generated based on the content.

The IMU 440 is an electronic device that generates data indicating a position of the HMD 405 based on measurement signals received from one or more of the position sensors 435 and from depth information received from the DCA 420. A position sensor 435 generates one or more measurement signals in response to motion of the HMD 405. Examples of position sensors 435 include: one or more accelerometers, one or more gyroscopes, one or more magnetometers, another suitable type of sensor that detects motion, a type of sensor used for error correction of the IMU 440, or some combination thereof. The position sensors 435 may be located external to the IMU 440, internal to the IMU 440, or some combination thereof.

Based on the one or more measurement signals from one or more position sensors 435, the IMU 440 generates data indicating an estimated current position of the HMD 405 relative to an initial position of the HMD 405. For example, the position sensors 435 include multiple accelerometers to measure translational motion (forward/back, up/down, left/right) and multiple gyroscopes to measure rotational motion (e.g., pitch, yaw, and roll). In some embodiments, the IMU 440 rapidly samples the measurement signals and calculates the estimated current position of the HMD 405 from the sampled data. For example, the IMU 440 integrates the measurement signals received from the accelerometers over time to estimate a velocity vector and integrates the velocity vector over time to determine an estimated current position of a reference point on the HMD 405. Alternatively, the IMU 440 provides the sampled measurement signals to the console 410, which interprets the data to reduce error. The reference point is a point that may be used to describe the position of the HMD 405. The reference point may generally be defined as a point in space or a position related to the HMD's 405 orientation and position.

The IMU 440 receives one or more parameters from the console 410. As further discussed below, the one or more parameters are used to maintain tracking of the HMD 405. Based on a received parameter, the IMU 440 may adjust one or more IMU parameters (e.g., sample rate). In some embodiments, certain parameters cause the IMU 440 to update an initial position of the reference point so it corresponds to a next position of the reference point. Updating the initial position of the reference point as the next calibrated position of the reference point helps reduce accumulated error associated with the current position estimated the IMU 440. The accumulated error, also referred to as drift error, causes the estimated position of the reference point to "drift" away from the actual position of the reference point over time. In some embodiments of the HMD 405, the IMU 440 may be a dedicated hardware component. In other embodiments, the IMU 440 may be a software component implemented in one or more processors.

The I/O interface 415 is a device that allows a user to send action requests and receive responses from the console 410. An action request is a request to perform a particular action. For example, an action request may be an instruction to start or end capture of image or video data, or an instruction to perform a particular action within an application. The I/O interface 415 may include one or more input devices. Example input devices include: a keyboard, a mouse, a game controller, or any other suitable device for receiving action requests and communicating the action requests to the console 410. An action request received by the I/O interface 415 is communicated to the console 410, which performs an action corresponding to the action request. In some embodiments, the I/O interface 415 includes an IMU 440, as further described above, that captures calibration data indicating an estimated position of the I/O interface 415 relative to an initial position of the I/O interface 415. In some embodiments, the I/O interface 415 may provide haptic feedback to the user in accordance with instructions received from the console 410. For example, haptic feedback is provided when an action request is received, or the console 410 communicates instructions to the I/O interface 415 causing the I/O interface 415 to generate haptic feedback when the console 410 performs an action.

The console 410 provides content to the HMD 405 for processing in accordance with information received from one or more of: the DCA 420, the HMD 405, and the I/O interface 415. In the example shown in FIG. 4, the console 410 includes an application store 450, a tracking module 455 and an engine 445. Some embodiments of the console 410 have different modules or components than those described in conjunction with FIG. 4. Similarly, the functions further described below may be distributed among components of the console 410 in a different manner than described in conjunction with FIG. 4.

The application store 450 stores one or more applications for execution by the console 410. An application is a group of instructions, that when executed by a processor, generates content for presentation to the user. Content generated by an application may be in response to inputs received from the user via movement of the HMD 405 or the I/O interface 415. Examples of applications include: gaming applications, conferencing applications, video playback applications, or other suitable applications.

The tracking module 455 calibrates the system environment 400 using one or more calibration parameters and may adjust one or more calibration parameters to reduce error in determination of the position of the HMD 405 or of the I/O interface 415. For example, the tracking module 455 communicates a calibration parameter to the DCA 420 to adjust the focus of the DCA 420 to more accurately determine positions of SL elements captured by the DCA 420. Calibration performed by the tracking module 455 also accounts for information received from the IMU 440 in the HMD 405 and/or an IMU 440 included in the I/O interface 415. Additionally, if tracking of the HMD 405 is lost (e.g., the DCA 420 loses line of sight of at least a threshold number of SL elements), the tracking module 455 may re-calibrate some or all of the system environment 400.

The tracking module 455 tracks movements of the HMD 405 or of the I/O interface 415 using information from the DCA 420, the one or more position sensors 435, the IMU 440 or some combination thereof. For example, the tracking module 455 determines a position of a reference point of the HMD 405 in a mapping of a local area based on information from the HMD 405. The tracking module 455 may also determine positions of the reference point of the HMD 405 or a reference point of the I/O interface 415 using data indicating a position of the HMD 405 from the IMU 440 or using data indicating a position of the I/O interface 415 from an IMU 440 included in the I/O interface 415, respectively. Additionally, in some embodiments, the tracking module 455 may use portions of data indicating a position or the HMD 405 from the IMU 440 as well as representations of the local area from the DCA 420 to predict a future location of the HMD 405. The tracking module 455 provides the estimated or predicted future position of the HMD 405 or the I/O interface 415 to the engine 445.

The engine 445 generates a 3D mapping of the area surrounding the HMD 405 (i.e., the "local area") based on information received from the HMD 405. In some embodiments, the engine 445 determines depth information for the 3D mapping of the local area based on information received from the DCA 420 that is relevant for techniques used in computing depth. The engine 445 may calculate depth information using one or more techniques to compute depth based on SL. A SL technique may include, e.g., using triangulation and/or perceived deformation of a SL pattern that is projected onto a surface to determine depth and surface information of objects within the scene. In various embodiments, the engine 445 uses different types of information determined by the DCA 420 or a combination of types of information determined by the DCA 420.

The engine 445 also executes applications within the system environment 400 and receives position information, acceleration information, velocity information, predicted future positions, or some combination thereof, of the HMD 405 from the tracking module 455. Based on the received information, the engine 445 determines content to provide to the HMD 405 for presentation to the user. For example, if the received information indicates that the user has looked to the left, the engine 445 generates content for the HMD 405 that mirrors the user's movement in a virtual environment or in an environment augmenting the local area with additional content. Additionally, the engine 445 performs an action within an application executing on the console 410 in response to an action request received from the I/O interface 415 and provides feedback to the user that the action was performed. The provided feedback may be visual or audible feedback via the HMD 405 or haptic feedback via the I/O interface 415.

Figure 5:
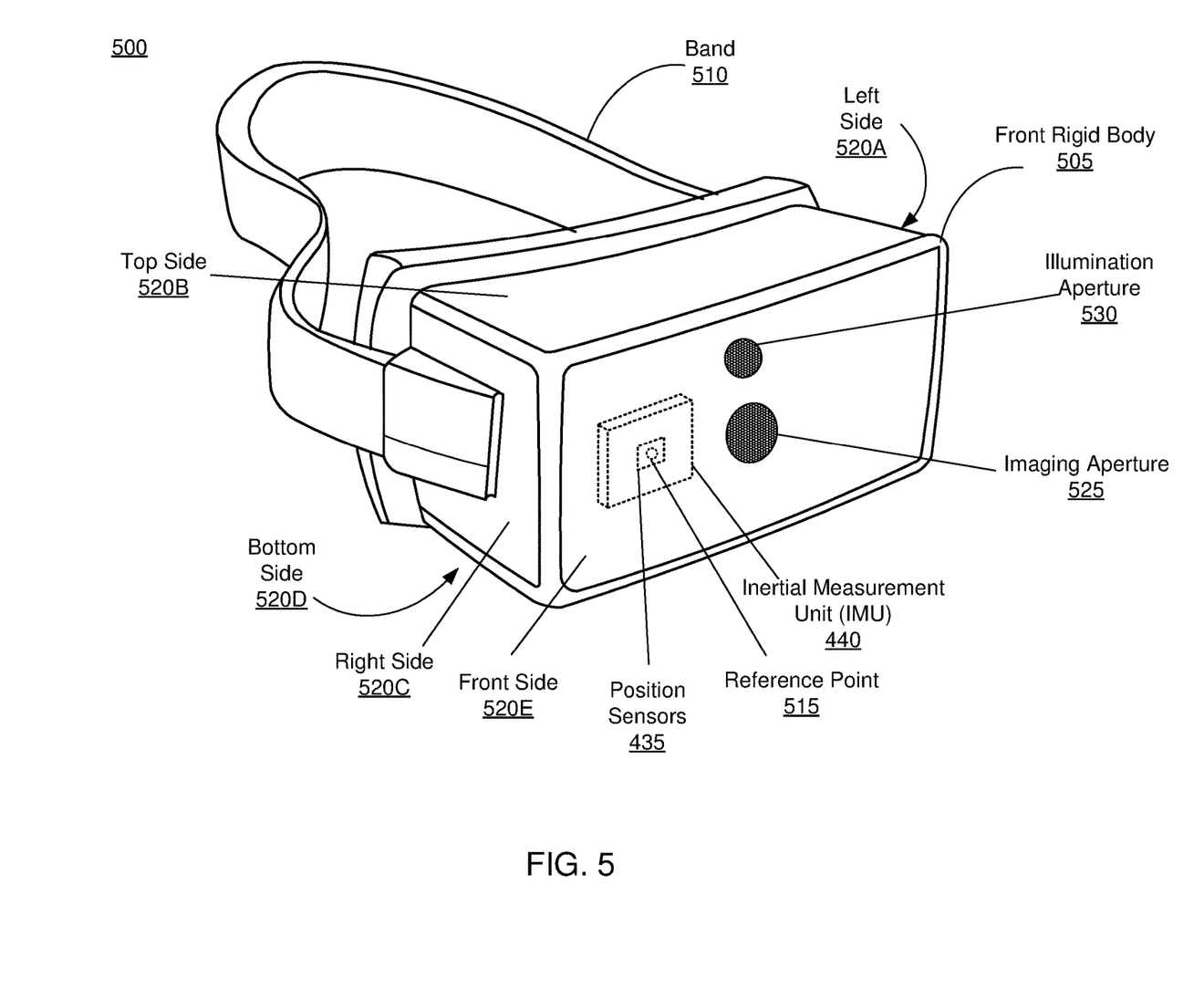
FIG. 5 is a diagram of a HMD, in accordance with an embodiment.

FIG. 5 is a wire diagram of one embodiment of a HMD 500. The HMD 500 is an embodiment of the HMD 405, and includes a front rigid body 505, a band 510, a reference point 515, a left side 520A, a top side 520B, a right side 520C, a bottom side 520D, and a front side 520E. The HMD 500 shown in FIG. 5 also includes an embodiment of the DCA 420 and depicts an imaging aperture 525 and an illumination aperture 530. The DCA 420 includes one or more illumination sources (not shown) that emits SL through the illumination aperture 530. The DCA 420 also includes one or more imaging devices (not shown) that capture SL from the illumination source and ambient light in the local area through the imaging aperture 525.

The front rigid body 505 includes one or more electronic display elements of the electronic display 425 (not shown), the IMU 440, the one or more position sensors 435, and the reference point 515. In some embodiments, of the front rigid body 505 may be at least partially transparent to visible light. For example, the front side 520E, the right side 520C, the left side 520A, the top side 520B, the bottom side 520D, or any combination thereof, may be at least partially transparent to visible light. Similarly, components within the HMD 500 may be at least partially transparent to visible light, such that a user is able to look through the HMD 500 into a local area surrounding the user.

Figure 6:
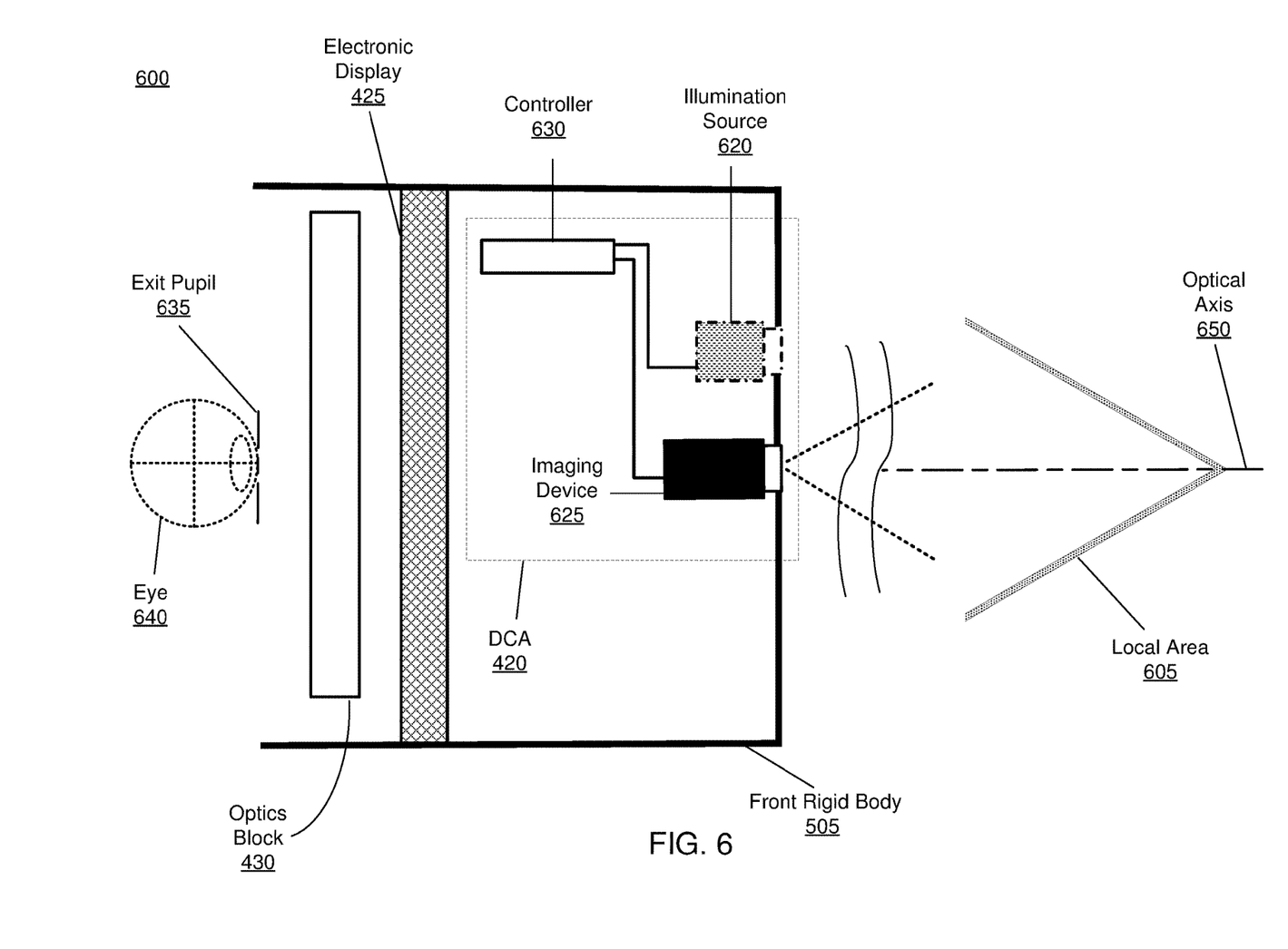
FIG. 6 is a cross section of a front rigid body of the HMD depicted in FIG. 5, in accordance with an embodiment.

FIG. 6 is a cross section 600 of the front rigid body 505 of the HMD 500 depicted in FIG. 5. As shown in FIG. 6, the front rigid body 505 includes an illumination source 620, an imaging device 625, and a controller 630. The front rigid body 505 also has an optical axis 650 corresponding to a path along which light propagates through the front rigid body 505. In some embodiments, the imaging device 625 is positioned along the optical axis 650 and captures images of a local area 605, which is a portion of an environment surrounding the front rigid body 505 within a field of view of the imaging device 625. Additionally, the front rigid body 505 includes the electronic display 425 and the optics block 430, which are further described above in conjunction with FIG. 4. The front rigid body 505 also includes an exit pupil 635 where the user's eye 640 is located. For purposes of illustration, FIG. 6 shows a cross section of the front rigid body 505 in accordance with a single eye 640. Although the cross section of FIG. 6 depicts the DCA 420 and the eye 640 being in the same plane for simplicity, the DCA 420 and the eye 640 may be in different planes. For example, in the embodiment shown in FIG. 5, the illumination aperture 530 and imaging aperture 525 of the DCA 420 are located in at a center vertical cross section HMD 500, while the eyes of the user are positioned on the right and left side of this center vertical cross sectional plane. The local area 605 reflects incident ambient light as well as light projected by the illumination source 620.

As described above in conjunction with FIG. 4, the electronic display 425 emits light forming an image toward the optics block 430, which alters the light received from the electronic display 425. The optics block 430 directs the altered image light to the exit pupil 635. FIG. 6 shows a cross section 600 of the front rigid body 505 for a single eye 640 of the user, with another electronic display 425 and optics block 430, separate from those shown in FIG. 6, included in the front rigid body 505 to present content, such as an augmented representation of the local area 605 or virtual content, to another eye of the user.

The depth camera assembly (DCA) 420 includes the illumination source 620, the imaging device 625, and the controller 630. The illumination source 620 illuminates a local area 605 with SL. Although FIG. 6 depicts a single illumination source 620, there may be multiple illumination sources, each illumination source may have a corresponding illumination aperture. In one embodiment, the illumination source 620 is configured to project IR light into a local area. The imaging device 625 supports an IR and a visible mode by including dual-band sensor pixel array to capture both visible and IR light. The dual-band sensor pixel array can be time multiplexed to capture visible light in a visible mode and IR light in an IR mode by applying a first voltage to the dual-band sensor pixel array. The imaging device 625 captures one or more first images (e.g., visible image) of the local area 605 illuminated with ambient light (e.g., not light from illumination source 620) while applying a first voltage to a corresponding input terminal of each pixel in the dual-band sensor pixel array. The imaging device 625 captures one or more second images of the local area 605 illuminated with light from the illumination source 620 while applying a second voltage to the corresponding input terminal of each pixel in the dual-band sensor pixel array. A controller 630 instructs the imaging device 625 to apply the first voltage to the corresponding input terminal of each pixel and capture the one or more first images of the local area illuminated with the ambient light. The controller 630 instructs the illumination source 620 to illuminate the local area 605 comprising one or more objects with light (e.g., IR SL and/or IR light for TOF). The controller 630 instructs the imaging device 625 to apply the second voltage to the corresponding input terminal of each pixel and capture the one or more second images of the local area 605 illuminated with light from the illumination source 620. The controller 630 determines depth information for the illuminated one or more objects based on the captured one or more second images. In one embodiment, the imaging device 625 captures IR SL and determines depth information based on a SL technique. In an alternate embodiment, the imaging device 625 captures IR light for TOF and determines depth information based on a TOF technique.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
   a semiconductor substrate including:
      a passivation layer formed underneath a backside surface of the semiconductor substrate;
      a first photodiode to generate a first charge in response to a first frequency component of light;
      a second photodiode to generate a second charge in response to a second frequency component of the light, the first photodiode and the second photodiode forming a stacked structure in the semiconductor substrate along an axis perpendicular to the backside surface; and
      a diffusion region, to receive the first charge or the second charge; and
   an input terminal electrically connected to the passivation layer to receive a voltage,
   wherein the voltage sets a potential of the passivation layer to control one of: a flow of the first charge from the first photodiode through the second photodiode to the diffusion region, or a flow of the second charge from the second photodiode through the first photodiode to the diffusion region.

2. The apparatus of claim 1, wherein the semiconductor substrate comprises:
   a first n-type layer to form the first photodiode;
   a p-type layer;
   a second n-type layer within the p-type layer to form the second photodiode; and
   a pinning layer; and
   wherein the passivation layer, the first n-type layer, the p-type layer, the second n-type layer, and the pinning layer forms the stack structure.

3. The apparatus of claim 1,
   wherein a first voltage applied to the input terminal allows the first charge accumulated in the first photodiode to flow through the second photodiode to the diffusion region for read out in a first operation mode associated with the first frequency component; and
   wherein a second voltage applied to the input terminal prevents the first charge accumulated in the first photodiode from flowing into the second photodiode when the second charge flows from the second photodiode to the diffusion region for read out in a second first operation mode associated with the first frequency component.

4. The apparatus of claim 1, wherein the apparatus is covered with a color filter.

5. The apparatus of claim 1, wherein the apparatus is part of a pixel cell of a sensor pixel array comprising a plurality of the pixel cells, and wherein the sensor pixel array is part of a depth camera assembly (DCA), the DCA comprising:
   an illumination source configured to project light into a local area;
   an imaging device comprising the sensor pixel array;
   a controller configured to:
      instruct the imaging device to apply a first voltage to the input terminal of each pixel cell of the sensor pixel array to capture one or more first images of the local area illuminated with ambient light;
      instruct the illumination source to illuminate the local area;

instruct the imaging device to apply a second voltage to the input terminal of each pixel cell of the sensor pixel array to capture one or more second images of the local area illuminated with light from the illumination source; and determine depth information for one or more objects of the local area based on the captured one or more second images.

6. An apparatus comprising:

a plurality of pixel cells formed in a semiconductor substrate, each pixel cell including:

a passivation layer formed underneath a backside surface of the semiconductor substrate;

a passivation layer formed underneath a backside surface of the semiconductor substrate;

a first photodiode to generate a first charge in response to a first frequency component of light;

a second photodiode to generate a second charge in response to a second frequency component of the light, the first photodiode and the second photodiode forming a stacked structure in the semiconductor substrate along an axis perpendicular to the backside surface; and a diffusion region to receive the first charge or the second charge; and an input terminal electrically connected to the passivation layer to receive a voltage, wherein the voltage sets a potential of the passivation layer to control one of: a flow of the first charge from the first photodiode through the second photodiode to the diffusion region, or a flow of the second charge from the second photodiode through the first photodiode to the diffusion region.

7. The apparatus of claim 6, wherein the plurality of pixel cells is covered with a color filter array.

8. The apparatus of claim 6, wherein the semiconductor substrate comprises, for each pixel cell:

a first n-type layer to form the first photodiode of each pixel cell;

a p-type layer;

a second n-type layer within the p-type layer to form the second photodiode of each pixel cell; and a pinning layer; and wherein the passivation layer, the first n-type layer, the p-type layer, the second n-type layer, and the pinning layer forms the stack structure.

9. The apparatus of claim 6, wherein a first voltage applied to the input terminal of each pixel cell allows the first charge accumulated in the first photodiode of the pixel cell to flow through the second photodiode of the pixel cell to the diffusion region of the pixel cell for read out in a first operation mode associated with the first frequency component; and wherein a second voltage applied to the input terminal of each pixel cell prevents the first charge accumulated in the first photodiode of the pixel cell from flowing into the second photodiode of the pixel cell when the second charge flows from the second photodiode of the pixel cell to the diffusion region of the pixel cell for read out in a second first operation mode associated with the first frequency component.

10. The apparatus of claim 6 that is part of a depth camera assembly (DCA), the DCA comprising:

an illumination source configured to project light into a local area;

an imaging device comprising the plurality of pixel cells;

a controller configured to:

instruct the imaging device to apply a first voltage to the input terminal of each pixel cell to capture one or more first images of the local area illuminated with ambient light;

instruct the illumination source to illuminate the local area;

instruct the imaging device to apply a second voltage to the input terminal of each pixel cell to capture one or more second images of the local area illuminated with light from the illumination source; and determine depth information for one or more objects of the local area based on the captured one or more second images.

11. An apparatus comprising:

an illumination source configured to project light into a local area; an imaging device comprising a plurality of pixel cells formed in a semiconductor substrate, wherein each pixel cell comprises: a passivation layer formed underneath a backside surface of the semiconductor substrate;

a passivation layer formed underneath a backside surface of the semiconductor substrate:

a first photodiode to generate a first charge in response to a first frequency component of light;

a second photodiode to generate a second charge in response to a second frequency component of the light, the first photodiode and the second photodiode forming a stacked structure in the semiconductor substrate along an axis perpendicular to the backside surface; and a diffusion region to receive the first charge or the second charge; and an input terminal electrically connected to the passivation layer to receive a voltage, wherein the voltage controls one of: a flow of the first charge from the first photodiode through the second photodiode to the diffusion region, or a flow of the second charge from the second photodiode through the first photodiode to the diffusion region;

a controller configured to:

instruct the imaging device to apply first voltage to the input terminal of each pixel cell of the plurality of pixel cells to capture one or more first images of the local area illuminated with ambient light;

instruct the illumination source to illuminate the local area;

instruct the imaging device to apply a second voltage to the input terminal of each pixel cell of the plurality of pixel cells to capture one or more second images of the local area illuminated with light from the illumination source; and determine depth information for one or more objects of the local area based on the captured one or more second images.

12. The apparatus of claim 11, wherein the plurality of pixel cells is covered with a color filter array.

13. The apparatus of claim 11, wherein the semiconductor substrate comprises:

a first n-type layer to form the first photodiode;

a p-type layer;

a second n-type layer within the p-type layer to form the second photodiode; and a pinning layer; and wherein the passivation layer, the first n-type layer, the p-type layer, the second n-type layer, and the pinning layer forms the stack structure.

14. The apparatus of claim 11, wherein the one or more first images is based on visible photoelectrons collected by the plurality of pixel cells.

15. The apparatus of claim 11, wherein the one or more second images is based on infrared photoelectrons collected from the plurality of pixel cells.

16. The apparatus of claim 11, wherein the light from the illumination source is infrared structured light.

17. The apparatus of claim 16, wherein the apparatus is part of a mobile device comprising:
- an electronic display element configured to display a virtual object based in part on the depth information; and
- an optics block configured to direct light from the electronic display element to an exit pupil of the mobile device.

18. The apparatus of claim 1, wherein the backside surface is configured to receive incident light which propagates through the first photodiode to reach the second photodiode;
- wherein the first photodiode is configured to convert a visible component of the incident light to the first charge; and
- wherein the second photodiode is configured to convert an infra-red (IR) component of the incident light to the second charge.

19. The apparatus of claim 1, wherein a surface opposite to the backside surface is configured to receive incident light which propagates through the second photodiode to reach the first photodiode;
- wherein the first photodiode is configured to convert an infra-red (IR) component of the incident light to the first charge; and
- wherein the second photodiode is configured to convert a visible component of the incident light to the second charge.

20. The apparatus of claim 1, further comprising a transfer gate over a channel region between the second photodiode and the diffusion region;
- wherein in a first operation mode, the transfer gate is configured to enable the first charge to flow through the channel region to the diffusion region; and
- wherein in a second operation mode, the transfer gate is configured to enable the second charge to flow through the channel region to the diffusion region.

21. The apparatus of claim 3, wherein the first voltage is a negative voltage; and
wherein the second voltage is a positive voltage.

22. The apparatus of claim 1, wherein the first frequency component includes an infra-red component; and
- wherein the second frequency component includes a visible light component.

* * * * *